United States Patent [19]

Kamps et al.

[11] Patent Number: 4,869,798
[45] Date of Patent: Sep. 26, 1989

[54] APPARATUS FOR THE GALVANIC REINFORCEMENT OF A CONDUCTIVE TRACE ON A GLASS PANE

[75] Inventors: Karl H. Kamps, Rheinberg; Hans C. Neuendorf, Wesel, both of Fed. Rep. of Germany

[73] Assignee: Flachglas Aktiengesellschaft, Furth, Fed. Rep. of Germany

[21] Appl. No.: 262,929

[22] Filed: Oct. 26, 1988

[30] Foreign Application Priority Data

Oct. 27, 1987 [DE] Fed. Rep. of Germany ....... 3736240

[51] Int. Cl.$^4$ .................... C25D 17/14; C25D 21/08; C25D 5/02
[52] U.S. Cl. .............................. 204/224 R; 204/271; 204/275; 204/292; 204/294; 204/290 F
[58] Field of Search ................... 204/224 R, 271, 275, 204/290 F, 292, 294

[56] References Cited

U.S. PATENT DOCUMENTS

| | | | |
|---|---|---|---|
| 2,135,873 | 11/1938 | Jones et al. | 204/224 R |
| 2,750,332 | 6/1956 | Miller | 204/224 R X |
| 3,697,405 | 10/1972 | Butler et al. | 204/275 |
| 3,857,772 | 12/1974 | Sasaki et al. | 204/224 R |
| 4,750,981 | 6/1988 | Dalland et al. | 204/224 R |
| 4,810,343 | 3/1989 | Bonnardel | 204/271 X |

Primary Examiner—Donald R. Valentine
Attorney, Agent, or Firm—Herbert Dubno

[57] ABSTRACT

An apparatus for the galvanic reinforcement of an automotive trace on a glass pane, especially a motor vehicle glass pane, has an elongated housing adapted to enclose the trace and spaced uniformly from opposite longitudinal edges thereof. The electrolyte and a rinsing liquid can be passed uniformly through this chamber within which a anode extends in juxtaposition with the trace which is poled as a cathode. Between the anode and the cathode an electrodeposition current is passed to deposit metal from the electrolyte onto the trace.

11 Claims, 2 Drawing Sheets

APPARATUS FOR THE GALVANIC REINFORCEMENT OF A CONDUCTIVE TRACE ON A GLASS PANE

FIELD OF THE INVENTION

Our present invention relates to an apparatus for the galvanic reinforcement of an elongated and usually linearly extending or rectilinear conductive trace on a glass pane. More particularly, the invention relates to an apparatus for the electrodeposition of a conductive material, namely, a metal, on a relatively thin strip of conductive material previously applied to a glass pane and especially a motor vehicle window glass such as a windshield, and whereby the conductive trace can be connected as a cathode for the electrodeposition process.

BACKGROUND OF THE INVENTION

In the formation of antenna patterns or patterns of heating or defrosting elements on an automotive glass pane, such as a windshield of an automotive vehicle, it is common to provide a conductive trace or strip which can be rectilinear and which can constitute a collector trace, busbar or the like in electrical connection with a plurality of other traces or wires. For example, the collector trace or busbar may run along one of the sides of the windshield or rear window of the automotive vehicle in a more or less upright manner whereas the other traces connected to this busbar or collector trace extend parallel to one another more or less horizontally.

The process can be used for heating the windshield or defrosting and deicing purposes or can serve as conductors forming parts of an antenna element or constituting antenna elements.

The collector trace or busbar is usually straight and can extend substantially the full length of an edge of the pane, e.g. a lateral edge thereof.

It is known that the trace can be built up or reinforced galvanically, i.e. by the electrodeposition of metal upon the conductive band.

In a conventional apparatus for this purpose as described in Japanese published application 60 159 194, the anode which is connected with the cathode to an electroplating current source, is constituted as a tampon which is impregnated with the electrolyte. This anode is brought into contact with the conductive trace and is moved slidingly therealong. This, of course, requires a service person so that this method of reinforcing a conductive trace is labor intensive. In fact, it cannot be automated in a practical manner.

However, it also has not been found to be desirable for other reasons as well. For example, the coating thickness of the reinforcement process depends upon the training and skill of the service person guiding the anode tampon along the trace. It cannot, therefore, be guaranteed that the deposit will be uniform or satisfactory.

Tampon electroplating, therefore, has found most interest in repair of electroplated objects (see Galvanotechnik 1982, pages 120 ff).

For other purposes, i.e. other purposes than the electroplating reinforcement of an elongated conductive trace on a glass pane, apparatus has been developed which provides a chamber which can be placed upon an electroplatable substrate (see German printed application DE-AS No. 16 21 143). Here the cathodes are constituted by the chamber wall. The anode in this arrangement, at least at its lower portion, is formed as a rod.

This results in potential and current density gradient and field conditions which prevent effective use of the apparatus for the uniform electroplating of conductor traces. The electrolyte is fed along the anode into the chamber and is carried away in a corresponding manner. This flow path and the escape of the electrolyte from the chamber and the fact that it can run onto the workpiece in an uncontrolled manner makes this system especially inconvenient for electroplating upon an elongated conductive trace on a glass pane, especially when the thickening of the trace by electrodeposition should be or must be effected automatically.

In various electrodeposition processes, moreover, it is necessary after deposition of material and even before such deposition or in intermediate phases between electrodepositions, to effect rinsing of the surface upon which the electrodeposit is to be formed or has been formed with water or other running liquids. In the past this had to be done in special apparatus and this, of course, was detrimental to mass production use of earlier techniques.

OBJECTS OF THE INVENTION

It is the principal object of the present invention to provide an apparatus for the galvanic reinforcement, i.e. the thickening by electrodeposition of a conductive trace of a glass pane which can obviate the drawbacks of earlier systems.

Another object of our invention is to provide an apparatus for the galvanic reinforcement of an elongated generally rectilinear conductive trace on a glass pane which can permit the electrodeposition thickening of the trace to be effected automatically and reliably to a predetermined thickness.

It is also an object of our invention to provide an improved apparatus for the electrodeposition of metal upon a conductive trace which permits rinsing at an appropriate time without difficulty.

SUMMARY OF THE INVENTION

These objects and others which will become apparent hereinafter are attained, in accordance with the present invention with an apparatus which includes an elongated housing having sealing edges along an open side thereof and adapted to be pressed against the glass pane so that a conductive trace of the latter is exposed to electrolyte which is fed through the housing.

According to the invention, the housing defines a chamber in which the conductive trace is exposed and an anode is mounted so as to extend along the conductive trace on a wall of the housing or chamber, preferably a wall confronting the glass pane.

The anode, of course, is connected to one terminal of the power supply while the cathode constituted by the conductive trace is connected to another terminal of the power supply and the connections are so poled that electrodeposition is effected from the electrolyte onto the conductive strip.

According to an important feature of the invention, the rim of the electrodeposition chamber is so seated upon the pane of glass that on opposite sides of the conductive trace, spacing strips are left between the conductive trace and this rim.

Between the anode in the chamber and the conductive trace there is a free space and means is provided for feeding an electrolyte to withdrawing the electrolyte from this space and for feeding a rinsing liquid to withdrawing the rinsing liquid from the space. The flow of electrolyte through the space should be uniformly effected between the anode and the cathode and means may be provided whereby the electrolyte and rinsing liquids are alternatingly caused to flow through this space.

If the thickness to which the trace is to be built up by electrodeposition is to be uniform over the length of the trace, the anode should be equidistant from the trace over its entire length.

To generate different thicknesses of the conductor on the glass, the anode can be inclined, or stepped or beveled or tapered.

Advantageously, moreover, the rim of the housing can have a soft elastic seal, e.g. a sealing strip which is applied to the housing.

The anode itself can be constituted of carbon or another metal such as copper provided with a titanium coating or from stainless steel.

In the case in which the galvanization chamber has a seating edge, this seating edge is preferably lined with a soft elastic material. This ensures that the electrodeposition will take place in a chamber sealed against leakage between the chamber and the glass tube.

The sealing strip has been found to be effective for glass panes which are completely flat as well as for glass panes which have simple curvature or are doubly curved. Of course, the chamber should have a geometry which corresponds to that of the glass pane.

Naturally, the kinematic reverse is also contemplated within the scope of the claims of the invention, namely, the case in which the glass pane is placed against the chamber.

In the best mode embodiment of the invention, however, the electrodeposition chamber is pressed against the glass pane in the region of the conductive trace which is to be amplified. This can be effected automatically or largely automatically. A seal is provided along the rim of the housing to accommodate any irregularities in the pane and thus the housing is sealed to the pane. The sealing should be as effective as is possible.

A movement of the anode relative to the cathodic conductive trace thus does not occur.

The electrolyte is passed from the fluid-inlet means into the chamber and is discharged through the fluid-outlet means. The thickness built up on the conductive trace can be easily controlled by regulating the parameters that normally are modified in electroplating technology, for example, the ion concentration in the electrolyte, the temperature and the current density.

Since the anode is a nonconsumable anode, e.g. of platinum or stainless steel, which does not go into solution, the electrolyte is not adversely affected by it.

The invention ensures that the current density can be predetermined along the entire length of the conductive trace within the housing and is not subject to detrimental gradients.

Rinsing is effected through the inlet and outlet means and does not require any special manipulation of the glass pane or any special apparatus.

Advantageously, the means for feeding the electrolyte to and withdrawing the electrolyte form the chamber and the means for feeding the rinsing liquid to and withdrawing the rinsing liquid from the chamber include fluid-inlet means communicating with the chamber at one end side thereof and fluid-outlet means communicating with the opposite end side of this chamber.

Alternatively, the inlet and outlet means can be provided along the longitudinal sides of the chamber so that the flow across the space separating the anode from the conductive strip is transverse to the longitudinal dimension. In both cases, the inlet and outlet means can include long-slit or wide-mouth nozzles which open substantially along the full length of the side upon which the inlet or outlet is disposed, i.e. over the full length of the corresponding side of the chamber.

This ensures that there will be a uniform electrolyte velocity across the space between the anode and the conductive trace and guarantees that the electric current and electrolyte-flow profiles which are selected by the configuration and orientation of the anode will control the thickness of the deposit to form on the conductive trace.

Advantageously, the apparatus should be positioned on the glass pane so that the spacing strips to either side of the conductive trace have the same width. This can ensure that the boundaries of the chamber defined by the housing, determining the boundary conditions of the electrolyte flow profile, will not disturb the flow in the region of the conductive trace. The flow can either be laminar or turbulent as desired.

The principal advantage achieved with the present invention is that the apparatus can be placed upon windshields or the like in a fully automatic or largely automatic manner to increase the thickness of longitudinally extending conductive traces on automotive glass panes in a reliable and convenient manner, and can yield collectors or busbars of predetermined thickness in a reliably and simply controlled manner, while permitting rinsing in an equally simple way.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
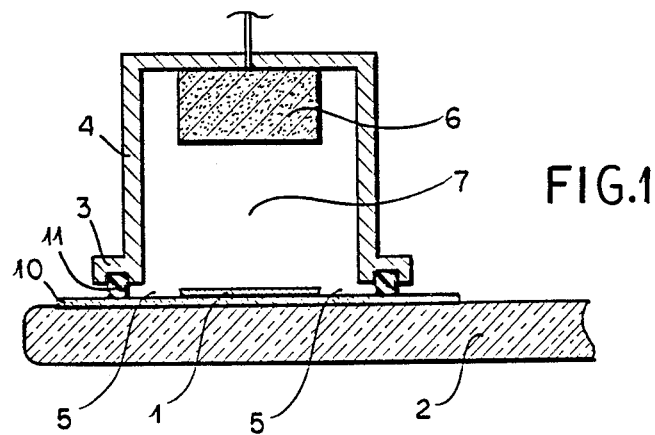
FIG. 1 is a vertical section through a glass pane and an apparatus in accordance with the present invention for increasing the thickness of a conductive trace on the glass pane.
Figure 2:
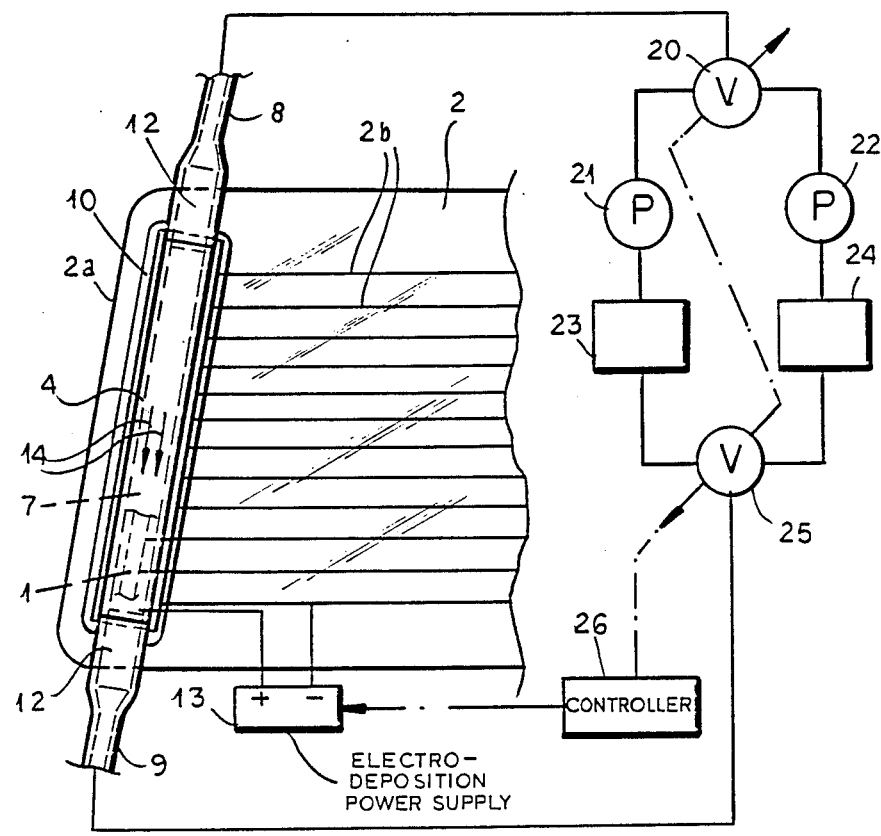
FIG. 2 is a plan view of the apparatus of FIG. 1 showing the parts of the structure for rinsing and flushing with electrolyte in flow diagram form.

From FIGS. 1 and 2, it will be apparent that a linearly extending conductive trace 1 applied to a glass pane 2 substantially parallel to a lateral edge 2a thereof and serving as a collector or busbar connected with heating wires or antenna wires 2b in or on this pane can be increased in thickness by electrodeposition.

The glass pane 2 is here shown to be a rear window of an automotive vehicle or a windshield thereof.

The conductive trace 1 is connected as a cathode to an electrodeposition power supply 13 shown only diagrammatically in FIG. 2.

The apparatus of the invention comprises a housing forming an electrodeposition chamber 4 which is elongated and of uniform cross section over its entire length parallel to the conductive trace 1.

At its downwardly turned side, the chamber 4 is open to the pane 2 and is provided with an outwardly turned rim 3 formed with a soft elastic sealing rib 11 which is adapted to rest against the pane and to seal the chamber against the pane in spite of irregularities in the surface of the pane contacted by the seal 11.

Within the housing or chamber 4, we have provided an anode 6 which is connected to the positive terminal of the electrodeposition power supply 13 (FIG. 2).

The apparatus rests on the pane so that the longitudinal portions of the rim 3 and the seal 4 flank the conductive trace 1 and are separated therefrom by spacer strips 5 which are of equal width.

The apparatus also includes a fluid-inlet means 8 for feeding the rinsing liquid and electrolyte to the chamber 4 and a fluid-outlet means 9 for conducting the electrolyte and rinsing liquid away form the chamber 4.

On its path from the inlet 8 to the outlet 9, the electrolyte travels through the uniform space 7 between the anode and the cathode uniformly so that electrodeposition is effected to deposit metal form the electrolyte onto the conductive trace to build up the latter. This metal may be copper, silver, gold or some other high conductivity metal which can also be corrosion-resistant.

Arrows 14 represent the flow path in the longitudinal direction from the inlet to the outlet.

As can be seen from FIG. 1, moreover, the conductive trace 1 is located along the edge 2a. Furthermore, below the conductive trace 1, a layer 10 of black ceramic can be provided with which the conductive trace 1 is laminated in the assembled state of the windshield.

In the embodiment illustrated and in the best mode of the invention, the soft elastic seal 11 can be composed of foam rubber and the anode 6 is composed of carbon.

Figure 3:
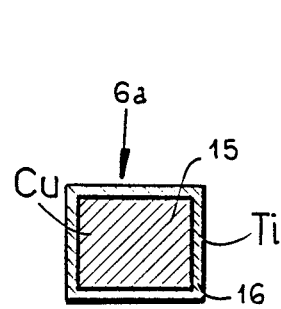
FIG. 3 is a cross section through an anode according to the invention.

Alternatively, the nonconsumable anode can comprise a highly conductive metal such as copper as can be seen at 15 in FIG. 3, coated with titanium 16 for the electrode 6a of this Figure.

Figure 4:
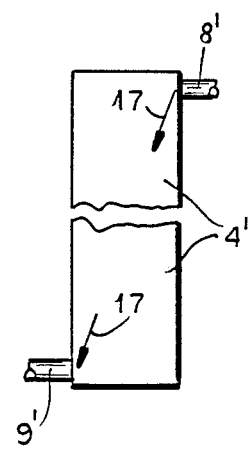
FIG. 4 is a plan view illustrating an arrangement of the fluid-inlet means and fluid-outlet means which differs from that of FIGS. 1 and 2.

Of course, as noted previously, the inlet and outlet arrangements can differ from those illustrated in FIGS. 1 and 2. For example, in FIG. 4 the liquid means can include a liquid inlet 8' located along one longitudinal side of the chamber 4' and at one longitudinal end thereof, while the outlet means 9' is located at the opposite longitudinal side and end so that the flow through the chamber 4' is generally diagonal as represented by the arrows 17 in FIG. 4.

Figure 5:
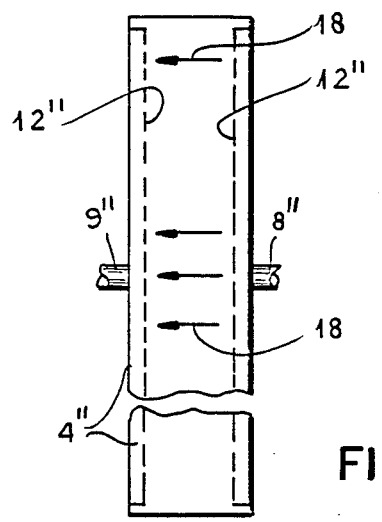
FIG. 5 is a plan view illustrating another arrangement of the fluid inlet and fluid-outlet means for the electroplating chamber of the invention.

In another alternative, best seen in FIG. 5, the inlet means 8" of the chamber 4" includes a long slit nozzle 12" all along one longitudinal side of the chamber while another nozzle 12" is provided for the outlet 9" all along the opposite longitudinal side of the chamber. The flow in this case is likewise uniform as represented by the arrows 18 but is transverse of the longitudinal dimension.

In the embodiment of FIGS. 1 and 2, broad-slit or long-slit nozzles 12 are provided for the inlet and outlet means 8 and 9, respectively, over the full width of each end face of the chamber 4.

From FIG. 2 it will also be apparent that a means is provided for circulating the liquids through the chamber 4, 4', 4". This means can include a switching valve 20 connected to the inlet 8, 8', 8" and communicating with pumps 21 and 22 respectively connected to an electrolyte reservoir 23 and a rinsing water reservoir 24.

The return from the outlet 9, 9', 9" is through another switching valve 25.

In operation, the conductive strip may initially be rinsed with water prior to electrodeposition.

To that end, valves 20 and 25 are switched to connect the pump 22 and the reservoir 24 to the chamber 4, 4', or 4", thereby flushing the chamber and the conductive trace 1. A controller 26 then switches over the valves 20 and 25 to cause electrolyte to flow through the chamber 4, 4' and 4" and at the same time cuts in the electrodeposition power supply 13 so that metal carried by the electrolyte in the form of ions is deposited on the conductive trace 1.

After the desired degree of buildup, the controller 26 switches off the power supply and again switches over the valves 20 and 25 to flush the electrodeposit free from traces of electrolyte. The process can then be repeated or the apparatus removed automatically from the pane and placed upon the next glass pane for repetition of the process with another conductive trace.

We claim:

1. An apparatus for electrochemically reinforcing an elongated conductive trace on a glass pane, comprising:
   a housing open in the direction of said glass pane and having sealing edges engaging said glass pane at locations flanking said conductive trace but spaced therefrom by spacing strips, said housing defining with said pane an elongated chamber extending along said trace;
   a nonconsumable electrode in said chamber extending along but spaced from said trace;
   electric supply means connected to said trace and said nonconsumable electrode so as to pole said trace as a cathode and said electrode as an anode in said chamber;
   fluid-inlet means and fluid-outlet means connected to said chamber for passing fluids through said chamber uniformly through a space between said electrode and said trace; and
   means connected to said fluid-inlet means for alternately supplying an electrolyte liquid from which metal is deposited on said trace and a rinsing liquid, as said fluids, to said chamber.

2. The apparatus defined in claim 1 wherein said sealing edges are formed with soft elastic sealing strips adapted to be pressed against said pane.

3. The apparatus defined in claim 1 wherein said electrode is composed of carbon, stainless steel, or a metal provided with a titanium coating.

4. The apparatus defined in claim 1 wherein said fluid-inlet and said fluid-outlet means are provided at opposite ends of said housing and said fluids pass longitudinally through said chamber.

5. The apparatus defined in claim 4 wherein said fluid-inlet means and said fluid-outlet means each is formed as a long-slit nozzle extending a full width of said chamber.

6. The apparatus defined in claim 5 wherein said sealing edges are formed with soft elastic sealing strips adapted to be pressed against said pane.

7. The apparatus defined in claim 6 wherein said electrode is composed of carbon, stainless steel, or a metal provided with a titanium coating.

8. The apparatus defined in claim 1 wherein said fluid-inlet and said fluid-outlet means are provided at opposite longitudinal sides of said housing and said fluids pass transversely through said chamber.

9. The apparatus defined in claim 8 wherein said fluid-inlet means and said fluid-outlet means each is formed as a long-slit nozzle extending a full length of said chamber.

10. The apparatus defined in claim 9 wherein said sealing edges are formed with soft elastic sealing strips adapted to be pressed against said pane.

11. The apparatus defined in claim 10 wherein said electrode is composed of carbon, stainless steel, or a metal provided with a titanium coating.

* * * * *